(12) United States Patent
Lim et al.

(10) Patent No.: US 11,925,059 B2
(45) Date of Patent: Mar. 5, 2024

(54) ORGANIC LIGHT EMITTING DIODE DISPLAY DEVICE WITH ELECTRODE DISPOSED OVER CONVEX PORTIONS OF INSULATING LAYER

(71) Applicant: LG Display Co., Ltd., Seoul (KR)

(72) Inventors: Hyun-Soo Lim, Goyang-si (KR); Kang-Ju Lee, Goyang-si (KR); Soo-Kang Kim, Paju-si (KR); Won-Hoe Koo, Goyang-si (KR); Min-Geun Choi, Asan-si (KR)

(73) Assignee: LG Display Co., Ltd., Seoul (KR)

(*) Notice: Subject to any disclaimer, the term of this patent is extended or adjusted under 35 U.S.C. 154(b) by 30 days.

(21) Appl. No.: 16/917,491

(22) Filed: Jun. 30, 2020

(65) Prior Publication Data

US 2020/0335728 A1 Oct. 22, 2020

Related U.S. Application Data (63) Continuation of application No. 15/717,640, filed on Sep. 27, 2017, now Pat. No. 10,734,611.

(30) Foreign Application Priority Data

Sep. 29, 2016 (KR) .................. 10-2016-0125693

(51) Int. Cl.
| | |
|---|---|
| *H10K 50/856* | (2023.01) |
| *H10K 50/813* | (2023.01) |
| *H10K 50/858* | (2023.01) |
| *H10K 59/122* | (2023.01) |
| *H10K 102/00* | (2023.01) |

(52) U.S. Cl.
CPC ......... *H10K 50/856* (2023.02); *H10K 50/813* (2023.02); *H10K 50/858* (2023.02); *H10K 59/122* (2023.02); *H10K 2102/3026* (2023.02)

(58) Field of Classification Search
CPC ............ H01L 51/5271; H01L 27/3246; H01L 51/5209; H01L 51/5275; H01L 2251/5315
USPC ..................................... 257/40, 98
See application file for complete search history.

(56) References Cited

U.S. PATENT DOCUMENTS

| | | | |
|---|---|---|---|
| 10,038,159 B2 | 7/2018 | Huang | |
| 2004/0160165 A1 | 8/2004 | Yamauchi | |
| 2008/0024402 A1* | 1/2008 | Nishikawa | ............. H05B 33/22 345/82 |
| 2011/0278538 A1 | 11/2011 | Ko et al. | |

(Continued)

FOREIGN PATENT DOCUMENTS

| | | |
|---|---|---|
| CN | 102244172 A | 11/2011 |
| CN | 102832227 A | 12/2012 |

(Continued)

*Primary Examiner* — Sheng-Bai Zhu
(74) *Attorney, Agent, or Firm* — Seed IP Law Group LLP (57) ABSTRACT

An organic light emitting diode display device includes a substrate having an emitting area and a non-emitting area. An insulating layer is on the substrate, and the insulating layer includes a plurality of convex portions, a plurality of connecting portions and at least one wall in the emitting area. A height of the at least one wall is greater than a height of the plurality of convex portions. A first electrode is on the substream, emitting layer is on the first electrode, a second electrode is on the emitting layer. The first electrode, the emitting layer and the second electrode constitute a light emitting diode.

16 Claims, 8 Drawing Sheets

(56) References Cited

U.S. PATENT DOCUMENTS

| | | |
|---|---|---|
| 2012/0313552 A1 | 12/2012 | Chang et al. |
| 2014/0131672 A1* | 5/2014 | Yoon .................. H01L 27/3262 |
| | | 438/34 |
| 2014/0306241 A1* | 10/2014 | Hirakata ................ H10K 50/86 |
| | | 257/79 |
| 2014/0332762 A1* | 11/2014 | Kim .................... H01L 27/3246 |
| | | 257/40 |
| 2014/0346449 A1 | 11/2014 | Choi et al. |
| 2015/0001486 A1 | 1/2015 | Kim et al. |
| 2016/0133869 A1 | 5/2016 | Nendai |
| 2017/0062528 A1* | 3/2017 | Aoyama ............. H01L 51/5284 |
| 2018/0122874 A1 | 5/2018 | Kim et al. |

FOREIGN PATENT DOCUMENTS

| | | |
|---|---|---|
| CN | 104253141 A | 12/2014 |
| CN | 105304672 A | 2/2016 |
| EP | 1 475 849 A2 | 11/2004 |
| KR | 10-2016-0080834 A | 7/2016 |

\* cited by examiner

ORGANIC LIGHT EMITTING DIODE DISPLAY DEVICE WITH ELECTRODE DISPOSED OVER CONVEX PORTIONS OF INSULATING LAYER

CROSS-REFERENCE TO RELATED APPLICATIONS

This application claims the benefit under 35 U.S.C. § 119(a) of Korean Patent Application No. 10-2016-0125693, filed Sep. 29, 2016, in the Korean Intellectual Property Office, which is incorporated herein by reference in its entirety.

BACKGROUND

Technical Field

The present disclosure relates to an organic light emitting diode display device, and more particularly, to an organic light emitting diode display device where a light extraction efficiency is improved.

Description of the Related Art

Since an organic light emitting diode (OLED) display device has an emissive type, the OLED display device does not require an additional light source differently from a liquid crystal display (LCD) device. As a result, the OLED display device may be fabricated to have a light weight and a thin profile. In addition, the OLED display device has advantages in a power consumption due to a low voltage driving as well as a color reproducibility, a response speed, a viewing angle and a contrast ratio. As a result, the OLED display device has been researched as a next generation display device.

A light of an emitting layer of the OLED display device is extracted outside the OLED display device through various elements. However, some of a total light of the emitting layer are not extracted outside the OLED display device to be trapped in the OLED display device. As a result, a light extraction efficiency is reduced.

In a bottom emission type OLED display device, specifically, the light trapped in the OLED display device due to a total reflection or an absorption by an anode are about 50% of a total light of the emitting layer, and the light trapped in the OLED display device due to a total reflection or an absorption by a substrate are about 30% of the total light of the emitting layer. Since the light of about 80% of the total light of the emitting layer are trapped in the OLED display device and only the light of about 20% of the total light of the emitting layer are extracted outside the OLED display device, the OLED display device has a relatively low light extraction efficiency.

To improve the light extraction efficiency of the OLED display device, an OLED display device including a micro lens array (MLA) on an outer surface of a substrate or in an overcoat layer has been suggested.

When the OLED display device including the micro lens array has a top emission type, some of a total light of an emitting layer are not extracted outside the OLED display device to be trapped in the OLED display device.

For example, some of the total light of the emitting layer are transmitted to an upper substrate. Among the light transmitted to the upper substrate, some light having an incident angle smaller than a total reflection critical angle (e.g., 42°) pass through the upper substrate to be extracted outside the OLED display device. Among the light transmitted to the upper substrate, other light having an incident angle equal to or greater than the total reflection critical angle are totally reflected on an interface between the upper substrate and the air. The light totally reflected on the interface between the upper substrate and the air has a path along a direction from the upper substrate to the emitting layer to be trapped in the OLED display device.

Since the light transmitted to the upper substrate with the incident angle equal to or greater than the total reflection critical angle is trapped in the OLED display device, a light extraction efficiency is reduced.

BRIEF SUMMARY

Embodiments relate to an organic light emitting diode display device including: a substrate having an emitting area and a non-emitting area; an insulating layer on the substrate, the insulating layer including a plurality of convex portions and at least one wall in the emitting area, a height of the at least one wall is greater than a height of the plurality of convex portions; a first electrode on the substrate; an emitting layer on the first electrode; and a second electrode on the emitting layer, the first electrode, the emitting layer and the second electrode constituting a light emitting diode.

Embodiments relate to an organic light emitting diode display device including: a substrate having an emitting area and a non-emitting area; an insulating layer on the substrate, the insulating layer including a wall in the emitting area; a first electrode on the substrate; a bank layer on the first electrode in the non-emitting area; an emitting layer on the first electrode; and a second electrode on the emitting layer, the first electrode, the emitting layer and the second electrode constituting a light emitting diode, wherein a height of the wall is less than a sum of heights of the insulating layer, the first electrode and the bank layer in the non-emitting area.

Advantages and features of the disclosure will be set forth in part in the description, which follows and in part will become apparent to those having ordinary skill in the art upon examination of the following or may be learned from practice of the disclosure. Other advantages and features of the embodiments herein may be realized and attained by the structure particularly pointed out in the written description and claims hereof as well as the appended drawings.

It is to be understood that both the foregoing general description and the following detailed description are explanatory, and are intended to provide further explanation of the embodiments as claimed.

BRIEF DESCRIPTION OF THE SEVERAL VIEWS OF THE DRAWINGS

The accompanying drawings, which are included to provide a further understanding of the disclosure, are incorporated in and constitute a part of this specification, illustrate implementations of the disclosure and together with the description serve to explain the principles of embodiments of the disclosure.

DETAILED DESCRIPTION

Reference will now be made in detail to embodiments of the present disclosure, examples of which are illustrated in the accompanying drawings. In the following description, when a detailed description of well-known functions or configurations related to this document is determined to unnecessarily cloud a gist of an embodiment of the disclosure, the detailed description thereof will be omitted. The progression of processing steps and/or operations described herein are provided as examples; however, the sequence of steps and/or operations is not limited to that set forth herein and may be changed in various embodiments, with the exception of steps and/or operations which are described as necessarily occurring in a certain order. Like reference numerals designate like elements throughout. Names of the respective elements used in the following explanations are selected only for convenience of writing the specification and may be thus different from those used in actual products.

Figure 1:
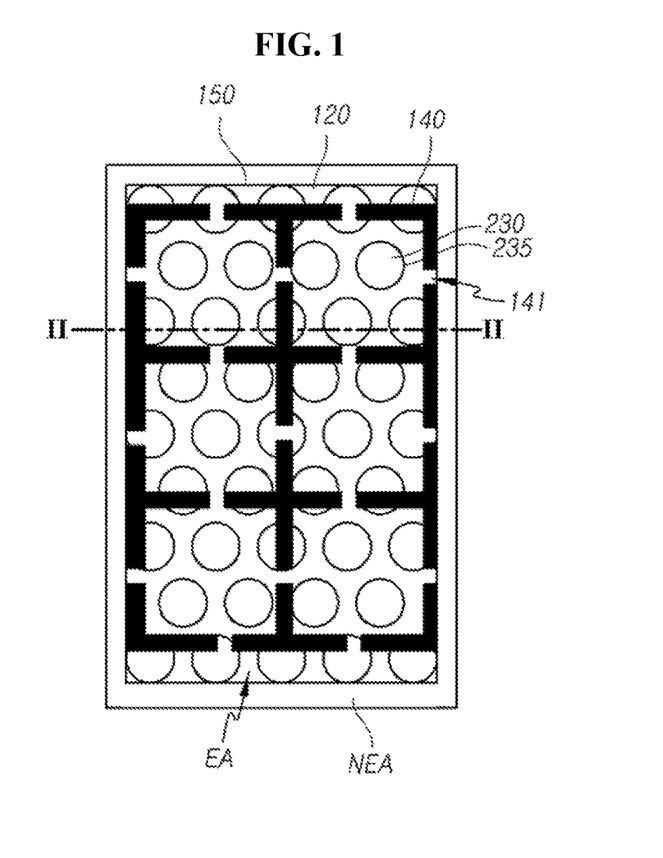
FIG. 1 is a plan view showing a sub-pixel of an organic light emitting diode display device according to a first embodiment of the present disclosure.

FIG. 1 is a plan view showing a sub-pixel of an organic light emitting diode display device according to a first embodiment of the present disclosure.

In FIG. 1, a sub-pixel of an organic light emitting diode (OLED) display device according to a first embodiment includes an emitting area EA and a non-emitting area NEA surrounding the emitting area EA. The emitting area EA and the non-emitting area NEA may be divided by a bank layer 150.

Although one sub-pixel is shown in FIG. 1, the OLED display device according to the first embodiment may include a plurality of sub-pixels. In addition, at least two sub-pixels may constitute one pixel.

The sub-pixel is a unit where a color filter layer of one color is formed or where an emitting layer emits a light of one color without a color filter layer. The sub-pixel may correspond to one of red, green, blue and white colors. The color corresponding to the sub-pixel is not limited to the above colors.

A scattering layer may be formed in the emitting area EA of the sub-pixel for increasing a light extraction efficiency of a light emitted from an emitting layer. The scattering layer may include one of a micro lens array, a plurality of micro lenses, a nano pattern, a diffusing pattern and a silica bead.

Although the scattering layer of a plurality of micro lenses is illustrated in embodiments hereinafter, the scattering layer may include various structures scattering a light in another embodiment.

An insulating layer 120 having a micro lens including a plurality of concave portions or a plurality of convex portions 230 is formed in the emitting area EA. The insulating layer 120 may include an organic insulating material. For example, the insulating layer 120 may be an overcoat layer. In addition, the micro lens may include the plurality of convex portions 230 and a plurality of connecting portions 235.

Although the micro lens having a circular shape is shown in FIG. 1, the micro lens may have various shapes including a polygonal shape and an elliptical shape in another embodiment.

The OLED display device according to the first embodiment may further include a wall 140 on the insulating layer 120. The wall 140 may be disposed between at least two micro lenses of the insulating layer 120.

In the emitting area EA, the wall 140 may be connected to an adjacent wall 140 through the plurality of convex portions 230 or the plurality of connecting portions 235. As a result, the insulating layer 120 of the OLED display device according to the first embodiment may include the plurality of convex portions 230, the plurality of connecting portions 235 and the plurality of walls 140. The plurality of convex portions 230 may be connected to each other through the plurality of connecting portions 235, and the plurality of walls 140 may be connected to each other through the plurality of convex portions 230 and the plurality of connecting portions 235. The plurality of connecting portions 235 may be tangential points between two convex portions 230. That is, the insulating layer 120 may have a structure such that the convex portions 230 are connected to one another at respective points from which each of the connected convex portions 230 extend upwardly in a convex arc. Alternatively, the connecting portions 235 may have a length that extends between two adjacent convex portions 230.

Figure 2:
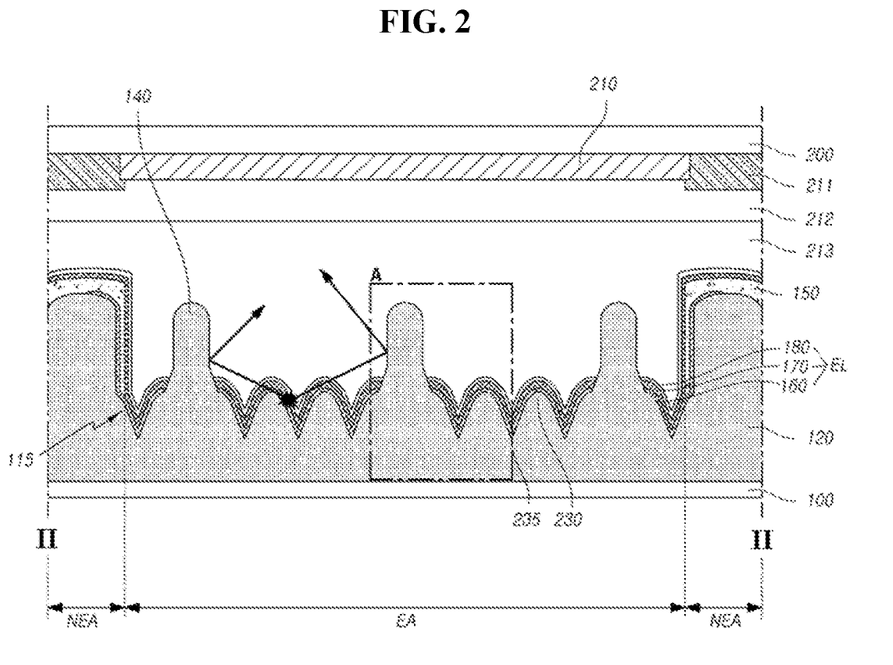
FIG. 2 is a cross-sectional view taken along a line II-II of FIG. 1.

The wall 140 may include an open portion 141 for an electrical connection of a first electrode of a light emitting diode EL (of FIG. 2). To prevent a light leakage between the sub-pixels (a light of the light emitting diode of the sub-pixel is emitted through the adjacent sub-pixel), the light emitting diode EL on a surface of the wall 140 is required not to emit a light. As a result, the first electrode of the light emitting diode EL may be partially removed on the surface of the wall 140, and the open portion 141 where the wall 140 is removed is formed in the emitting area EA for the smooth electrical connection of the light emitting diode EL on the plurality of convex portions 230 and the plurality of connecting portions 235. Accordingly, the wall 140 may be disposed to be separated from the adjacent wall 140 in the emitting area EA, and the wall 140 and the adjacent wall 140 may be connected to each other through the plurality of convex portions 230 and the plurality of connecting portions 235. The first electrode may be electrically connected through the open portion 141 where the wall 140 is removed, and the first electrode in the open portion 141 may function as a current path for the light emitting diode EL.

The plurality of walls 140 may change a path of components of a light trapped in the OLED display device among a total light of the light emitting diode EL and may emit the components outside the OLED display device.

FIG. 2 is a cross-sectional view taken along a line II-II of FIG. 1.

In FIG. 2, the OLED display device according to the first embodiment includes a first substrate 100 having the emitting area EA and the non-emitting area NEA and a second substrate 200 facing the first substrate 100. The first substrate 100 may be an array substrate having a plurality of thin film transistors (TFTs), and the second substrate may be a color filter substrate having a plurality of color filter layers 210.

The insulating layer 120, the bank layer 150 and the light emitting diode EL may be formed on an inner surface of the first substrate 100. The color filter layer 210, a black matrix 211 and an overcoat layer 212 may be formed on an inner surface of the second substrate 200. A resin layer 213 may be formed between the first and second substrates 100 and 200.

Although the insulating layer 120 on the first substrate 100 has a single layer in FIG. 2, the insulating layer 120 on the first substrate 100 may have multiple layers in another embodiment.

The insulating layer 120 includes the plurality of convex portions 230, the plurality of connecting portions 235 and the plurality of walls 140. The light emitting diode EL including a first electrode 160, an emitting layer 170 and a second electrode 180 is formed on the plurality of convex portions 230 and the plurality of connecting portions 235.

The light emitting diode EL may have an unevenness on a surface thereof due to a morphology of a plurality of micro lenses. The light emitting diode EL may have a flatness in another embodiment.

At least one step difference 115 may be formed on the insulating layer 120 in the non-emitting area NEA or in the emitting area EA adjacent to the non-emitting area NEA, and an electric open of the first electrode 160 on the insulating layer 120 may be prevented by the at least one step difference 115. The at least one step difference 115 may alleviate a stiffness of a slope of the insulating layer 120 due to the micro lens to prevent the electric open of the first electrode 160 on the insulating layer 120.

The bank layer 150 overlapping the insulating layer 120 and the first electrode 160 is formed in the non-emitting area NEA. The bank layer 150 may define the emitting area EA and the non-emitting area NEA of the first substrate 100.

A height of the plurality of walls 140 on the insulating layer 120 may be greater than a height of the plurality of convex portions 230. For example, a height of the plurality of walls 140 may be greater than twice of a height of the plurality of convex portions 230.

Since the OLED display device according to the first embodiment includes the plurality of walls 140 having the height greater than the height of the plurality of convex portions 230, the light extraction efficiency for the light of the light emitting diode EL is improved.

When the OLED display device including the plurality of micro lenses in the emitting area EA has a top emission type, some of a light emitted from the light emitting diode EL may not pass through the second substrate 200 to be trapped in the OLED display device.

For example, some of the light of the light emitting diode EL may be emitted toward the second substrate 200 and may reach the second substrate 200 through the second electrode 180, the resin layer 213, the overcoat layer 212 and the color filter layer 210. A light having an incident angle smaller than a total reflection critical angle (e.g., 42°) among the light reaching the second substrate 200 may pass through the second substrate 200 to be extracted outside the OLED display device.

A light having an incident angle equal to or greater than the total reflection critical angle among the light reaching the second substrate 200 may be totally reflected at an interface between the second substrate 200 and the air outside the OLED display device. A path of the light totally reflected at the interface of the second substrate 200 and the air may be changed toward the color filter layer 210 and the light totally reflected at the interface of the second substrate 200 and the air may be trapped in the OLED display device.

Among the light of the emitting layer 170, only the light having an incident angle smaller than the total reflection critical angle with respect the second substrate 200 may be extracted outside the OLED display device and the light having an incident angle equal to or greater than the total reflection critical angle may be trapped in the OLED display device.

In the OLED display device having the plurality of micro lenses in the emitting area EA, a main emitting area of the light emitting diode EL corresponds to a slanting surface of the plurality of micro lenses. Since the emitting layer 170 has a smallest thickness in a region corresponding to the slanting surface of the micro lens, a current density increases and an emission efficiency of the light emitting diode increases in the region corresponding to the slanting surface as compared with the other regions.

However, a lot of lights in the region corresponding to the slanting surface among the light of the light emitting diode EL have an incident angle equal to or greater than the total reflection critical angle. In the region corresponding to the slanting surface of the plurality of micro lenses, since a lot of lights among the light of the light emitting diode EL are not extracted outside the second substrate 200 and are trapped in the OLED display device, the light extraction efficiency is reduced.

To solve the above problem, the OLED display device according to the first embodiment includes the plurality of walls 140 connected to the plurality of convex portions 230 and the plurality of connecting portions 235 in the emitting area EA. The height of the plurality of walls 140 may be greater than the height of the plurality of convex portions 230.

The path of the light from the main emitting area corresponding to the slanting surface of the plurality of convex portions 230 is changed by the plurality of walls 140, and the light proceeds toward the second substrate 200 to have an incident angle smaller than the total reflection critical angle. As a result, the light extraction efficiency of the light emitted from the region corresponding to the slanting surface of the plurality of convex portions 230 is improved.

For example, some of the light of the light emitting diode EL (specifically, the light of the region corresponding to the slanting surface of the plurality of convex portions 230) may be emitted toward the second substrate 200 or may be reflected by the first electrode 160 of a reflecting electrode to proceed toward the second substrate 200.

Since some of the light reach the second substrate 200 to have an incident angle smaller than the total reflection critical angle, some of the light may be extracted outside the second substrate 200. For example, some of the light of the light emitting diode EL may pass through the emitting layer 170, the second electrode 180, the resin layer 213, the overcoat layer 212 and the color filter layer 210 to reach the second substrate 200 with an incident angle smaller than the total reflection critical angle and may be extracted outside the second substrate 200.

In addition, some of the light of the light emitting diode EL may pass through the emitting layer 170, the first electrode 160 of a reflecting electrode, the emitting layer 170, the second electrode 180, the resin layer 213, the overcoat layer 212 and the color filter layer 210 to reach the second substrate 200 with an incident angle smaller than the total reflection critical angle and may be extracted outside the second substrate 200.

Further, the light having an incident angle equal to or greater than the total reflection critical angle may reach at least one of the plurality of walls 140. For example, some of the light of the light emitting diode EL may pass through the emitting layer 170, the second electrode 180 and the resin layer 213 to reach the wall 140. Alternatively, some of the light of the light emitting diode EL may pass through the emitting layer 170, the first electrode 160, the emitting layer 170, the second electrode 180 and the resin layer 213 to reach the wall 140.

The wall 140 may have a refractive index of about 1.5 equal to a refractive index of the insulating layer 120. The resin layer 213 may have a refractive index of about 1.7 to about 2.0 greater than a refractive index of the wall 140. When the light of the emitting layer 170 reaches the wall 140, the light proceeds from the resin layer 213 having a relatively high refractive index to the wall 140 having a relatively low refractive index, and the light having an incident angle equal to or greater than the total reflection critical angle may be totally reflected at a boundary between the resin layer 213 and the wall 140.

The light totally reflected at the boundary between the resin layer 213 and the wall 140 may pass through the resin layer 213, the overcoat layer 212 and the color filter layer 212 to reach the second substrate 200 with an incident angle smaller than the total reflection critical angle. As a result, the light incident to the second substrate 200 with an incident angle smaller than the total reflection critical angle may be extracted from the OLED display device.

Since a path of some of the light proceeding with an incident angle equal to or greater than the total reflection critical angle is changed to have an incident angle smaller than the total reflection critical angle by the wall 140, an amount of the light extracted outside the OLED display device increases and the light extraction efficiency of the OLED display device is improved.

Although three convex portions 230 and three connecting portions 235 are formed between the plurality of walls 140 in FIG. 2, three to six convex portions 230 and three to six connecting portions 235 may be formed between the plurality of walls 140 in another embodiment. In the cross-sectional view of FIG. 2, the three convex portions 230 that are positioned between respective pairs of the walls 140 may include two full convex portions 230, i.e., convex portions 230 that form a complete convex arc between two connecting portions 235. A third convex portion 230 may be formed of two separated halves of a convex portion 230, e.g., half-portions that extend with a convex arc from a connecting portion 235 to a boundary of a wall 140. When the plurality of convex portions 230 smaller than three and the plurality of connecting portions 235 smaller than three are formed between the plurality of walls 140, a density of the plurality of walls 140 in the emitting area EA increases. Since an area where the light emitting diode does not emit a light in the emitting area EA increases, an aperture ratio of the OLED display device may be reduced.

When the plurality of convex portions 230 greater than six and the plurality of connecting portions 235 greater than six are formed between the plurality of walls 140, some of the light proceeding toward the second substrate 200 with an incident angle equal to or greater than the total reflection critical angle in the region corresponding to the slanting surface of the plurality of convex portions 230 may not meet the wall 140. As a result, improvement of the light extraction efficiency due to the plurality of walls 140 may be reduced.

A height of the plurality of walls 140 may be greater than a height of the plurality of convex portions 230. For example, the height of the plurality of walls 140 may be equal to or greater than twice of the height of the plurality of convex portions 230. Since the height of the plurality of walls 140 is greater than the height of the plurality of convex portions 230, a path of the light having an incident angle equal to greater than the total reflection critical angle is changed such that the light is extracted outside the OLED display device.

For example, most of light having an incident angle equal to or greater than the total reflection critical angle may proceed toward the second substrate 200. When the height of the plurality of walls 140 is equal to or smaller than the height of the plurality of convex portions 230, the light of the light emitting diode EL may not meet one of the plurality of walls 140. As a result, a path of the light may not be changed by the plurality of walls 140.

The plurality of walls 140 in the emitting area EA may function as a reflecting wall changing a path of a light. However, when the light emitting diode EL is formed on the plurality of walls 140, the plurality of walls 140 may not function as a reflecting wall. As a result, the first electrode 160 of the light emitting diode EL may be formed to expose an upper portion of the plurality of walls 140.

Figure 3:
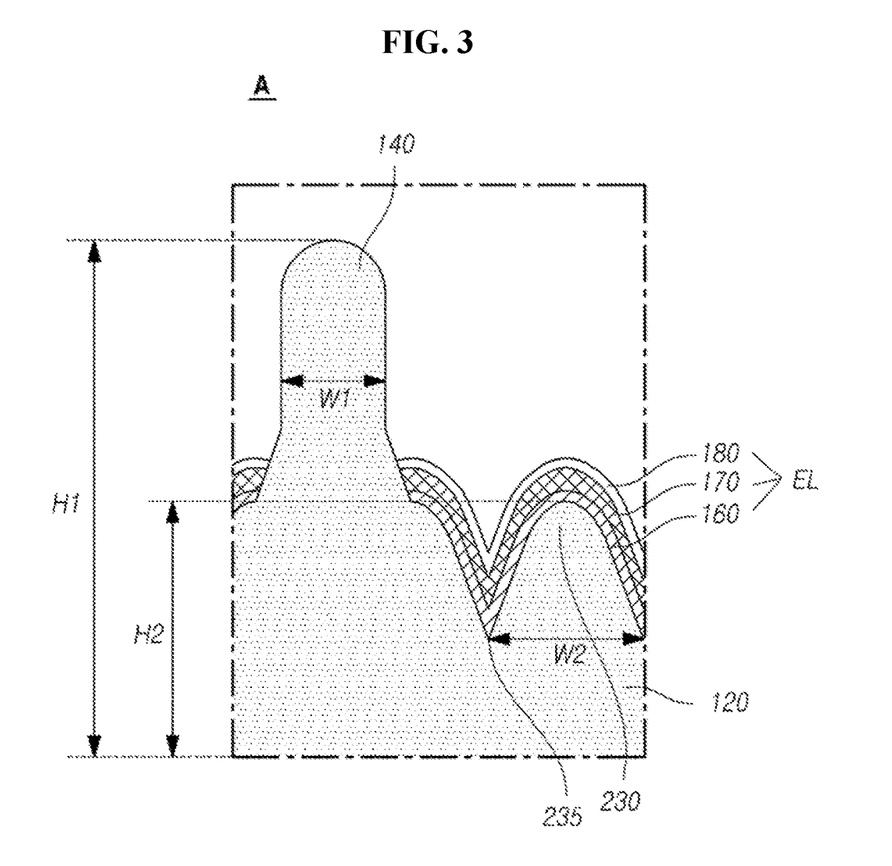
FIG. 3 is a magnified view showing a portion A of FIG. 2.

FIG. 3 is a magnified view showing a portion A of FIG. 2.

In FIG. 3, the OLED display device according to the first embodiment includes the insulating layer 120 having the wall 140, the convex portion 230 and the connecting portion 235 in the emitting area EA.

A first height H1 of the wall 140 may be greater than a second height H2 of the convex portion 230. The first height H1 of the wall 140 is defined as a length from the inner surface of the first substrate 100 to a top surface of the wall 140, and the second height H2 of the convex portion 230 is defined as a length from the inner surface of the first substrate 100 to a top surface of the convex portion 230. Since the first height H1 of the wall 140 is greater than the second height H2 of the convex portion 230, the light proceeding from the light emitting diode EL to the second substrate 200 with an incident angle equal to or greater than the total reflection critical angle may be changed by the wall 140 to have an incident angle smaller than the total reflection critical angle. The wall 140 may change a path of the light having an incident angle equal to or greater than the total reflection critical angle using a principle of total reflection.

When the light emitting diode EL is formed on a surface of the wall 140 and the light emitting diode EL emits a light, a light leakage may occur. Accordingly, the light emitting diode EL may be designed not to be formed on the surface of the wall 140. Since the first height H1 of the wall 140 is formed to be greater than the second height H2 of the convex portion 230, a light emitted from the light emitting diode EL on the surface of the wall 140 proceeds to the other sub-pixel to cause a light leakage.

Since the first height H1 of the wall 140 is formed to be greater than the second height H2 of the convex portion 230, some of the light emitted from the light emitting diode EL on the surface of the wall 140 may not be absorbed by the bank layer to proceed to the other sub-pixel. The light not absorbed by the bank layer may become the light leakage.

To prevent the light leakage, the light emitting diode EL on the surface of the wall 140 may be separated from the light emitting diode EL on the surface of the convex portion 230 adjacent to the wall 140. For example, the first electrode 160, the emitting layer 170 and the second electrode 180 may be patterned in a portion of the surface of the wall 140 to be removed. The first electrode 160, the emitting layer 170 and the second electrode 180 of the light emitting diode EL may be formed to expose the portion of the surface of the wall 140.

A first width W1 of the wall 140 may be smaller than a second width W2 of the convex portion 230. The first width W1 of the wall 140 is defined as a maximum length when the wall 140 is horizontally cut, and the second width W2 of the convex portion 230 is defined as a length connecting adjacent two connecting portions 235. For example, the second width W2 of the convex portion 230 may be 4 μm to 5 μm, and the first width W1 of the wall 140 may be 1.5 μm to 2 μm. When the first width W1 is smaller than 1.5 μm, it may be hard to form the wall 140. When the first width W1 is greater than 2 μm, an area where a light is not emitted in the emitting area EA may be enlarged and an amount of a light emitted from one emitting area EA may be reduced.

Although the light emitting diode EL is not formed in a portion of the surface of the wall 140 in FIG. 3, a part of the light emitting diode EL may not be formed in a portion of the surface of the wall 140 in another embodiment.

Figure 4:
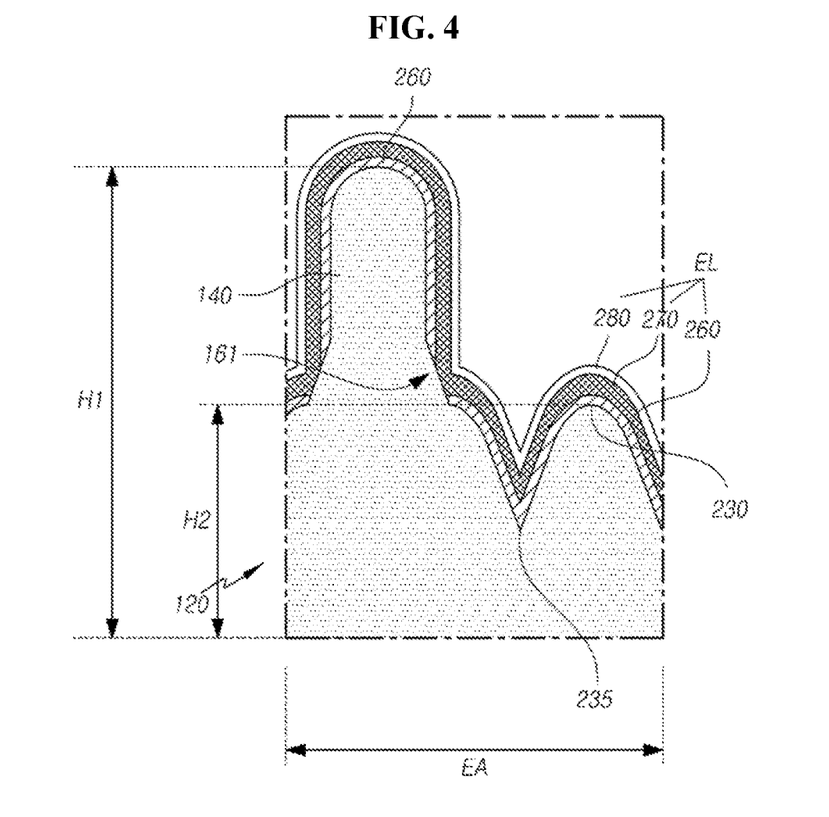
FIG. 4 is a cross-sectional view showing a portion of a sub-pixel of an organic light emitting diode display device according to a second embodiment of the present disclosure.

FIG. 4 is a cross-sectional view showing a sub-pixel of an organic light emitting diode display device according to a second embodiment of the present disclosure.

In FIG. 4, a first electrode 260 of a light emitting diode EL on a surface of a wall 140 may have a cutting portion 161 to expose a side portion of the wall 140. Differently from FIG. 3, an emitting layer 270 and a second electrode 280 may be formed on the whole surface of the wall 140.

Since the first electrode 260 has the cutting portion 161 on the side surface of the wall 140, a current is not supplied to the light emitting diode EL on the surface of the wall 140 and the light emitting diode EL may not emit a light.

In the OLED display device according to the first and second embodiments, since the light emitting diode EL is not formed on the surface of the wall 140 or the light emitting diode EL on the surface of the wall 140 does not emit a light, a light leakage due to the light from the wall 140 to the other sub-pixel may be prevented.

Figure 5:
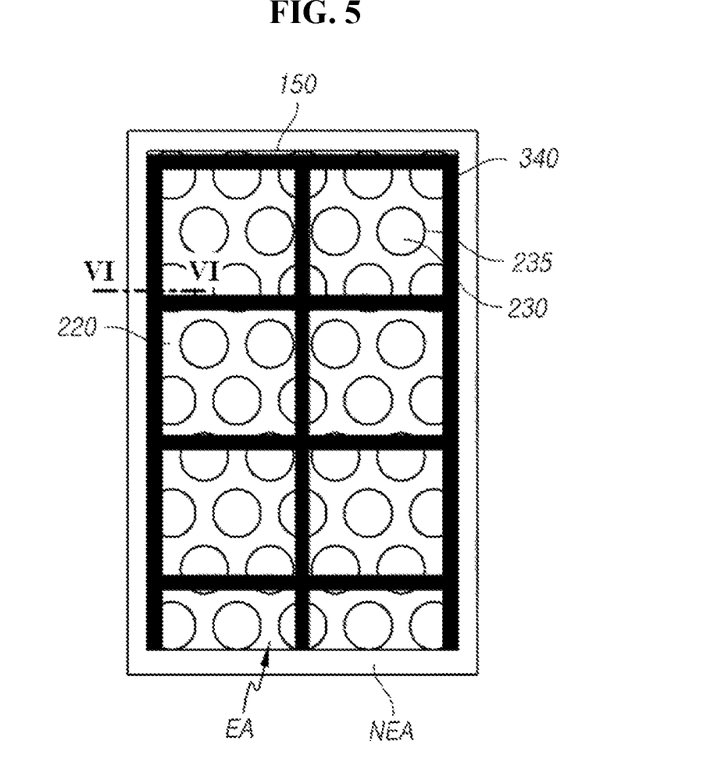
FIG. 5 is a plan view showing a sub-pixel of an organic light emitting diode display device according to a third embodiment of the present disclosure.

FIG. 5 is a plan view showing a sub-pixel of an organic light emitting diode display device according to a third embodiment of the present disclosure. The OLED display device according to the third embodiment may include the same elements as the OLED display device according to the first and second embodiments. Illustration about the same elements may be omitted and the same elements may be designated by the same reference numbers.

In FIG. 5, an organic light emitting diode (OLED) display device according to a third embodiment includes an insulating layer 220 having a plurality of convex portions 230, a plurality of connecting portions 235 and a wall 340 in an emitting area EA. The plurality of convex portions 230 may be connected to the plurality of connecting portions 235. The wall 340 may be connected to the plurality of convex portions 230 and the plurality of connecting portions 235.

The wall 340 of the OLED display device according to the third embodiment may have a shape of connected rectangles in the emitting area EA. The wall 340 of the third embodiment is wholly connected in the emitting area EA differently from the wall 140 of the first embodiment.

Figure 6:
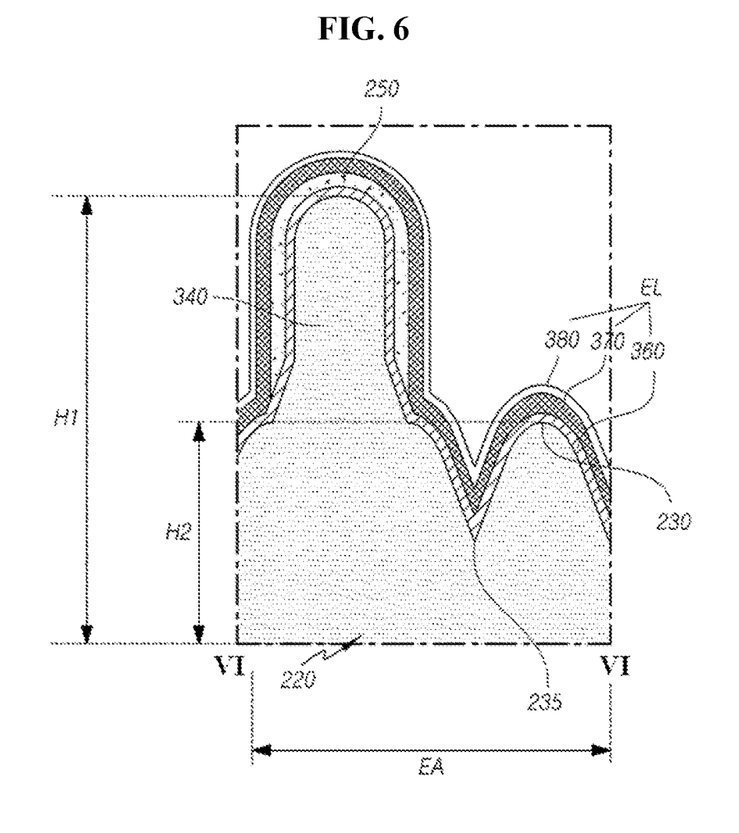
FIG. 6 is a cross-sectional view taken along a line VI-VI of FIG. 5.

FIG. 6 is a cross-sectional view taken along a line VI-VI of FIG. 5.

In FIG. 6, the OLED display device according to the third embodiment includes the insulating layer 220 having the wall 340, the convex portion 230 and the connecting portion 235 in the emitting area EA. The light emitting diode EL including a first electrode 360, an emitting layer 370 and a second electrode 380 is formed on the insulating layer 220.

The OLED display device according to the third embodiment includes a light shielding pattern 250 in a portion of the surface of the wall 340 differently from the OLED display device according to the first embodiment. Since the light shielding pattern 250 is formed in a portion of the surface of the wall 340 of the OLED display device according to the third embodiment, emission of the light emitting diode EL on the surface of the wall 340 is prevented.

The plurality of convex portions 230 and the plurality of connecting portions 235 may be formed between the plurality of walls 340. For example, three to six convex portions 230 and three to six connecting portions 235 may be formed between the plurality of walls 340. When the plurality of convex portions 230 smaller than three and the plurality of connecting portions 235 smaller than three are formed between the plurality of walls 140, a density of the plurality of walls 340 in the emitting area EA increases. Since an area where the light emitting diode does not emit a light in the emitting area EA increases, an aperture ratio of the OLED display device may be reduced.

When the plurality of convex portions 230 greater than six and the plurality of connecting portions 235 greater than six are formed between the plurality of walls 340, some of the light proceeding toward the second substrate 200 with an incident angle equal to or greater than the total reflection critical angle in a region corresponding to a slanting surface of the plurality of convex portions 230 may not meet the wall 340. As a result, improvement of the light extraction efficiency due to the plurality of walls 340 may be reduced.

Figure 7:
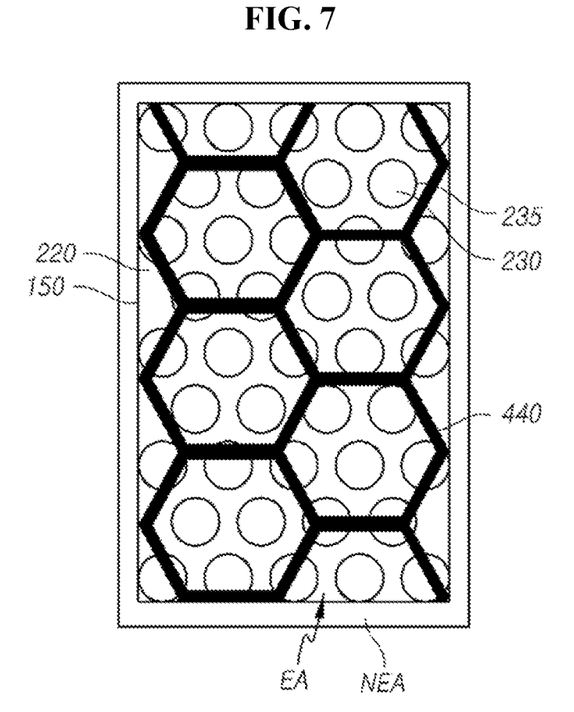
FIG. 7 is a plan view showing a sub-pixel of an organic light emitting diode display device according to a fourth embodiment of the present disclosure.

FIG. 7 is a plan view showing a sub-pixel of an organic light emitting diode display device according to a fourth embodiment of the present disclosure. The OLED display device according to the fourth embodiment may include the same elements as the OLED display device according to the first to third embodiments. Illustration about the same elements may be omitted and the same elements may be designated by the same reference numbers.

In FIG. 7, an organic light emitting diode (OLED) display device according to a fourth embodiment includes an insulating layer 220 having a plurality of convex portions 230, a plurality of connecting portions 235 and a wall 440 in an emitting area EA. The plurality of convex portions 230 may be connected to the plurality of connecting portions 235. The wall 440 may be connected to the plurality of convex portions 230 and the plurality of connecting portions 235.

Although the wall 440 of the OLED display device according to the fourth embodiment may have a shape of connected hexagons in the emitting area EA, the wall 440 may have a shape of connected polygons or connected circles in another embodiment.

As a result, the wall 440 of the embodiments may have a shape connected to the plurality of convex portions 230 and the plurality of connecting portions 235. When a light of a light emitting diode proceeds to a second substrate with an incident angle equal to or greater than a total reflection critical angle, the light is reflected by the wall 440 to proceed with an incident angle smaller than the total reflection critical angle.

Figure 8:
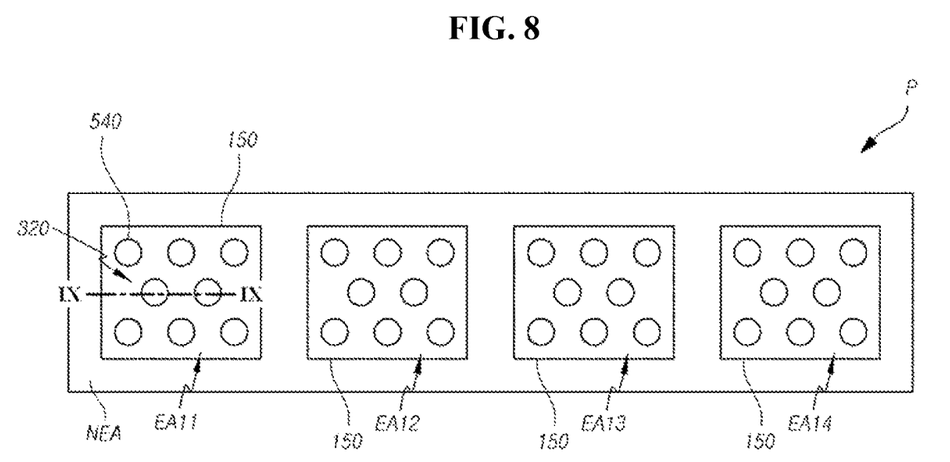
FIG. 8 is a cross-sectional view showing an organic light emitting diode display device according to a fifth embodiment of the present disclosure.

FIG. 8 is a cross-sectional view showing an organic light emitting diode display device according to a fifth embodiment of the present disclosure. The OLED display device according to the fifth embodiment may include the same elements as the OLED display device according to the first to fourth embodiments. Illustration about the same elements may be omitted and the same elements may be designated by the same reference numbers.

In FIG. 8, an organic light emitting diode (OLED) display device according to a fifth embodiment includes a pixel P having first to fourth emitting areas EA11, EA12, EA13 and EA14. Each of the first to fourth emitting areas EA11, EA12, EA13 and EA14 may include a plurality of walls 540 of an insulating layer 320.

A light of a light emitting diode proceeding to a second substrate with an incident angle equal to or greater than a total reflection critical angle may be reflected by the plurality of walls 540 to have an incident angle smaller than the total reflection critical angle.

The OLED display device according to the fifth embodiment may include the plurality of walls 540 in the first to fourth emitting areas EA11, EA12, EA13 and EA14 and may not include a plurality of convex portions and a plurality of connecting portions.

Figure 9:
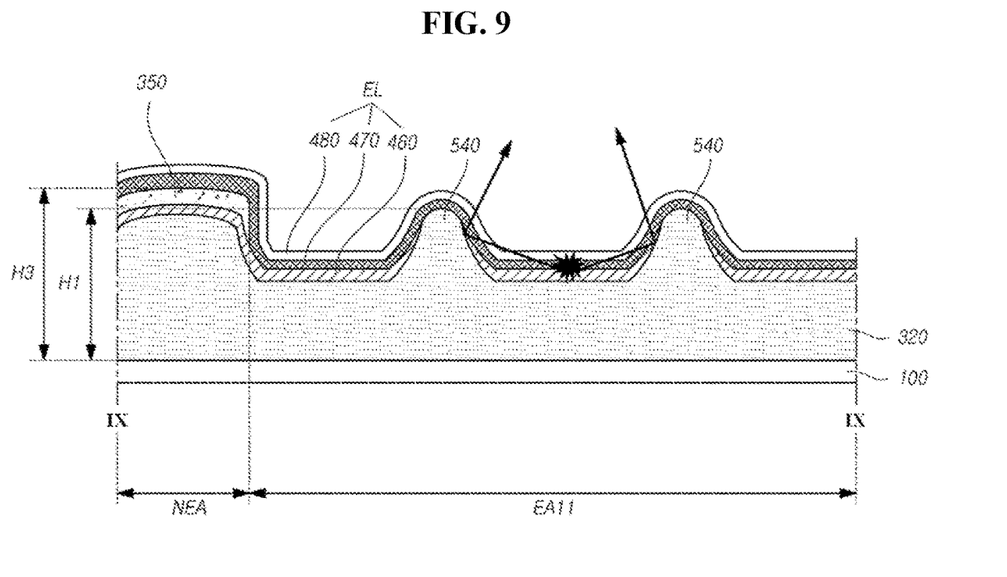
FIG. 9 is a cross-sectional view taken along a line IX-IX of FIG. 8.

FIG. 9 is a cross-sectional view taken along a line IX-IX of FIG. 8.

In FIG. 9, the OLED display device according to the fifth embodiment includes the insulating layer 320 having the plurality of walls 540 in the first emitting area EA11. A first electrode 460 of the light emitting diode EL is formed on the insulating layer 320. The first electrode 460 may be formed in the first emitting area EA11 except for an upper surface of the plurality of walls 540 and may extend to a non-emitting area NEA.

As a result, the light emitting diode EL on the upper surface of the plurality of walls 540 may not emit a light. Since the light emitting diode EL on the upper surface of the plurality of walls 540 does not emit a light, a light leakage due to the light from the wall 540 to the adjacent sub-pixel may be prevented.

A bank layer 350 may be formed on the first electrode 460 in the non-emitting area NEA. A third height H3 which is a sum of heights of the insulating layer 320, the first electrode 460 and the bank layer 350 in the non-emitting area NEA may be greater than a first height H1 of the wall 540. Stated differently, the bank layer 350 extends to a third height H3 from the surface of the substrate 100, which is greater than a first height H1 of the walls 540 from the surface of the substrate 100.

Since the third height H3 of the insulating layer 320, the first electrode 460 and the bank layer 350 is greater than the first height H1 of the plurality of walls 540, a light proceeding to the adjacent sub-pixel among a light of a side of the plurality of walls 540 may be sufficiently absorbed by the bank layer 350.

An emitting layer 470 and a second electrode 480 may be sequentially formed on the bank layer 350, the first electrode 460 and the plurality of walls 540.

The first emitting area EA11 of the OLED display device according to the fifth embodiment may emit a light except for the upper surface of the plurality of walls 540. A light proceeding to the second substrate with an incident angle equal to or greater than the total reflection critical angle among a light from a flat region between the plurality of walls 540 is totally reflected by at least one of the plurality of walls 540. The totally reflected light may proceed to the second substrate with an incident angle smaller than the total reflection critical angle to be extracted outside the second substrate.

Consequently, since the OLED display device according to embodiments of the present disclosure includes the wall in the emitting area, the light having an incident angle equal to or greater than the total reflection critical angle among the light of the light emitting diode may be totally reflected. The totally reflected light may proceed to the second substrate with an incident angle smaller than the total reflection critical angle to be extracted outside the second substrate. As a result, the light extraction efficiency of the OLED display device is improved.

In addition, since the OLED display device according to embodiments of the present disclosure includes the wall having the height greater than the height of the plurality of convex portions, the amount of the light trapped in the OLED display device is reduced and the light extraction efficiency of the OLED display device is improved.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting diode display device, comprising:
   a substrate having an emitting area and a non-emitting area;
   an insulating layer over the substrate, the insulating layer having micro lenses including a plurality of convex portions in the emitting area;
   a first electrode over the insulating layer;
   a bank over the first electrode in the non-emitting area;
   an emitting layer over the first electrode extending to a top surface of the bank in non-emitting area; and
   a second electrode over the emitting layer,
   wherein a portion of the plurality of convex portions extends from the emitting area to the non-emitting area,
   wherein the first electrode extends to a slanting surface of the plurality of convex portions in the non-emitting area,
   wherein a thickness of the insulating layer in the non-emitting area is greater than a thickness of the plurality of convex portions of the micro lens of the insulating layer in the emitting area,
   wherein the bank covers the first electrode over the slanting surface of the convex portion of the insulating layer in the non-emitting area,
   wherein the insulating layer further includes at least one wall in the emitting area, and
   wherein the at least one wall extends from a top surface of the insulating layer, and a top surface of the at least one wall is exposed through the first electrode.

2. The device of claim 1, further comprising: a color filter layer corresponding to the emitting area.

3. The device of claim 2, wherein an edge of the color filter layer extends beyond an edge of the plurality of convex portions toward the non-emitting area, and
   wherein the first electrode over the slanting surface of the plurality of convex portions of the non-emitting area overlaps with the color filter.

4. The device of claim 2, wherein an edge of the plurality of convex portions, an edge of the bank and an edge of the color filter layer overlap each other in the non-emitting area.

5. The device of claim 1, wherein the bank overlays an edge of the plurality of convex portions.

6. The device of claim 1, wherein a boundary between the emitting area and the non-emitting area overlaps a portion of the plurality of convex portions of the micro lenses configured to improve a light extraction efficiency.

7. The device of claim 1, wherein the plurality of convex portions are arranged in a line along a first direction and staggered along a second direction.

8. The device of claim 1, wherein the insulating layer further includes at least one wall in the emitting area, and
wherein a top portion of the at least one wall is directly contacted byte the emitting layer in the emitting area.

9. The device of claim 8, wherein portions of the first electrode around the at least one wall are electrically connected to each other in the emitting area.

10. The device of claim 1, wherein the insulating layer further includes at least one wall,
wherein the first electrode is disposed in the emitting area to expose a side portion of the at least one wall, and
wherein the emitting layer and the second electrode are disposed on the first electrode and the at least one wall.

11. The device of claim 10, wherein portions of the first electrode around the at least one wall are electrically connected to each other in the emitting area.

12. The device of claim 1, wherein the insulating layer further includes at least one wall, and
wherein the first electrode is disposed in the emitting area to cover a top portion of the at least one wall.

13. The device of claim 12, wherein portions of the first electrode around the at least one wall are electrically connected to each other in the emitting area.

14. The device of claim 12, further comprising a light shielding pattern disposed over the first electrode over the at least one wall.

15. The device of claim 1, wherein the convex portion of the insulating layer has a first height at the non-emitting area greater than a second height of the convex portion of the insulating layer at the emitting area.

16. An organic light emitting diode display device, comprising:
a substrate having an emitting area and a non-emitting area;
an insulating layer over the substrate, the insulating layer having micro lenses including a plurality of convex portions in the emitting area;
a first electrode over the insulating layer;
a bank over the first electrode in the non-emitting area;
an emitting layer over the first electrode extending to a top surface of the bank in non-emitting area; and
a second electrode over the emitting layer,
wherein a portion of the plurality of convex portions extends from the emitting area to the non-emitting area,
wherein the first electrode extends to a slanting surface of the plurality of convex portions in the non-emitting area,
wherein the convex portion of the insulating layer in the non-emitting area has a first height from a bottom surface to a top surface of the insulating layer,
wherein the convex portion of the insulating layer in the emitting area has a second height from a bottom surface to a top surface of the insulating layer,
wherein the first height is greater than the second height,
wherein the insulating layer further includes at least one wall in the emitting area, and
wherein the at least one wall extends from a top surface of the insulating layer, and a top surface of the at least one wall is exposed through the first electrode.

\* \* \* \* \*

UNITED STATES PATENT AND TRADEMARK OFFICE
CERTIFICATE OF CORRECTION

PATENT NO. : 11,925,059 B2
APPLICATION NO. : 16/917491
DATED : March 5, 2024
INVENTOR(S) : Hyun-Soo Lim et al.

Page 1 of 1

It is certified that error appears in the above-identified patent and that said Letters Patent is hereby corrected as shown below:

On the Title Page

Item (57) Abstract:
"substream emitting layer" should read: --substrate, an emitting layer--.

Item (57) Abstract:
"electrode, a second" should read: --electrode, and a second--.

In the Claims

Column 13, Claim 8, Line 16:
"contacted byte the emitting layer" should read: --contacted by the emitting layer--.

Signed and Sealed this
Sixteenth Day of July, 2024

Katherine Kelly Vidal
*Director of the United States Patent and Trademark Office*